United States Patent
Takano

[11] Patent Number: 5,949,566
[45] Date of Patent: Sep. 7, 1999

[54] OPTICAL TRANSMITTER

[75] Inventor: Isamu Takano, Tokyo, Japan

[73] Assignee: NEC Corporation, Tokyo, Japan

[21] Appl. No.: 09/002,705

[22] Filed: Jan. 5, 1998

Related U.S. Application Data

[62] Division of application No. 08/612,417, Mar. 7, 1996, Pat. No. 5,880,869.

[30] Foreign Application Priority Data

Mar. 7, 1995 [JP] Japan ................................... 7-047554

[51] Int. Cl.$^6$ ........................................................ H04B 10/04
[52] U.S. Cl. .............................. 359/180; 359/184; 372/25
[58] Field of Search ...................................... 359/180, 184, 359/185, 187, 186; 372/38, 30, 50

[56] References Cited

U.S. PATENT DOCUMENTS

| | | | |
|---|---|---|---|
| 3,925,735 | 12/1975 | Ozeki et al. | 332/7.51 |
| 5,548,435 | 8/1996 | Tahara et al. | 359/180 |
| 5,694,409 | 12/1997 | Taguchi | 372/38 |
| 5,706,117 | 1/1998 | Imai et al. | 359/187 |

*Primary Examiner*—Rafael Bacares
*Attorney, Agent, or Firm*—Sughrue, Mion, Zinn, Macpeak & Seas, PLLC

[57] ABSTRACT

In order to provide an optical transmitter applicable for a transmission speed range higher than 1 Gb/s without transmission quality degradation, the embodiment of the invention comprises a flipflop having a set terminal supplied with a transmission signal and a variable delay circuit for delaying an inverse output of the flipflop to be supplied to a reset terminal of the flipflop, for equalizing pulse width of the laser light with that of the transmission signal.

4 Claims, 4 Drawing Sheets

OPTICAL TRANSMITTER

This application is a division of application Ser. No. 08/612,417 filed Mar. 07, 1996 now Pat. No. 5,880,869.

BACKGROUND OF THE INVENTION

This invention relates to an optical transmitter, and more particularly to an optical transmitter with a laser diode of low threshold current density.

Recently, optical transmission technology has been developed remarkably and ultra high speed optical transmission technologies by way of a single mode optical fiber, an optical transmission device for a long wave laser light, are investigated for realizing a large capacity long distance transmission.

Especially for providing a wide area communication network used for delivering multimedia services such as video picture, audio sound or information data, a high-speed, stable and practical optical transmitter is expected.

In the wide area communication network, not only for the trunk lines, where time division multiplex signals of several giga-bits per second are transmitted requiring a high-speed and wide band transmitter, but also for subscriber lines, these optical transmission technologies are attracting considerable attention as a feasible strategy for providing a high quality subscriber line interface for multimedia services.

Basic functions needed of the optical transmitter/receiver are so called 3R, that is, resharping (or equivalent amplification), retiming and regeneration. In the regeneration among them, the optical transmitter plays an important role to send out final transmission signals.

Therefore, cost reduction of the optical transmitter is a hot theme for developement of subscriber communication systems.

As for the cost reduction of optical transmitters, a regulation free setting of bias current of a laser diode, a simplification of a driving circuit of the laser diode or a reduction of power consumption of the circuit has been investigated, and recentry as a result of developement of a low threshold laser diode, a zero-bias modulation is realized, which is reported in "Zero-bias Modulation of extremely Low Threshold 1.3 $\mu$m DFB-PPIH laser diode", Ohkura et al, Optical Communication Society 88–15, pp. 37 to 41.

FIG. 5 illustrates a circuit configuration of a conventional optical transmitter using a comparatively low threshold current density laser diode as its optical source. Input signals are amplified by a laser diode driver (hereafter abbreviated to a LD driver) 51 to a signal level sufficient for activating a laser diode (hereafter abbreviated to a LD) 52, which sends out optical outputs 54 according to driving pulses 53 supplied from the LD driver 51. Wave forms of a driving pulse 53 and a corresponding optical output 54 are shown in FIG. 6.

In general, when a LD is used without bias, it causes a radiation delay, which depends on threshold value of the LD and becomes longer with the higher threshold value. Therefore, a radiation delay longer than a signal period may cause information defects. This is an important problem of the LD.

The radiation delay td of a LD, used with bias lower than its threshold value, is given by a following equation;

$$td = Ts \times ln\{Jp/(Jp-Jth+Jb)\} \quad (1)$$

where, Ts, Jth, Jb and Jp denote carrier lifetime, threshold current value, bias current value and driving current value respectively, the driving current value defined as a current value difference between a peak current and the bias current.

From equation (1), the radiation delay td of about 250 ps is given in a LD with a threshold current value Jth of 3.5 mA activated by a driving current Jp of 40 mA without bias current. So, in a conventional optical transmitter as shown in FIG. 5 with a comparatively low threshold LD 52, the optical output 54 is delayed from the driving pulse 53 as shown in FIG. 6.

The radiation delay td of a LD represented by equation (1) is on condition that the LD is activated with a driving pulse after a certain interval. The radiation delay td becomes shorter when the LD is activated with a driving pulse following other preceding pulses than that after the interval, since carrier density in active layers of the LD 52 widely fluctuates depending on pulse patterns of the driving pulse 53.

Consequently, a radiation delay td1 for a first pulse #1 of the optical output 54 in FIG. 6, which equals td obtained from the equation (1), is longer than the next radiation delay td2 for a following pulse #2.

This fluctuation of the radiation delay results in jitters of rising edges of the optical output 54, and when transmission speed becomes high, more than 1 Gb/s for example, influences of the radiation delay td and the jitters become important compared to pulse widths, degrading the transmission characteristic and limiting the errorless transmission speed.

In prior art reducing the radiation delay td, a LD bias circuit 74 is provided as illustrated in FIG. 7 for supplying a bias current to the LD 52 as shown in FIG. 8. However, the bias current of the prior art cancels the merit of low dissipation of the comparatively low threshold LD 52 and complicates the circuit configration of the optical transmitter.

SUMMARY OF THE INVENTION

Therefore, a primary object of the present invention is to materialize an optical transmitter which can transmit optical signals according to transmission data of various speeds higher than 1 Gb/s, without quality degradation with a simple circuit of low dissipation.

Another object of the invention is to materialize an optical transmitter which can transmit optical signals according to transmission data of various speeds, with few pattern jitters.

In order to achieve the objects, an optical transmitter of an embodiment of the present invention with a laser diode having a low threshold old characteristic for emitting a laser light according to a pulse current supplied corresponding to a transmission signal comprises equivalence means for revising a pulse width of the transmission signal for equalizing a pulse width of the laser light to a pulse width of the original transmission signal.

Therefore, the decrease of pulse widths of the optical output because of the radiation delay is eliminated, resulting in a stable transmission.

An optical transmitter of another embodiment of the present invention further comprises variable amplitude laser diode driver for amplifying the transmission signal revised by the equivalence means for supplying to the laser diode with an amplitude determined according to a bit rate of the transmission signal.

Therefore, the errorless transmission speed range higher than 1 Gb/s can be enlarged of the optical transmitter of the embodiment with a low threshold LD and a simple circuit of low dissipation, by decreasing the pattern jitters caused by the radiation delay depending on pulse patterns.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

In connection with the drawings, embodiments of the present invention will be described in the following paragraphs.

The embodiments are applied in an optical transmitter wherein a LD of comparatively low threshold current density is activated by a driving current composed of pulses corresponding to a transmission signal.

Figure 1:
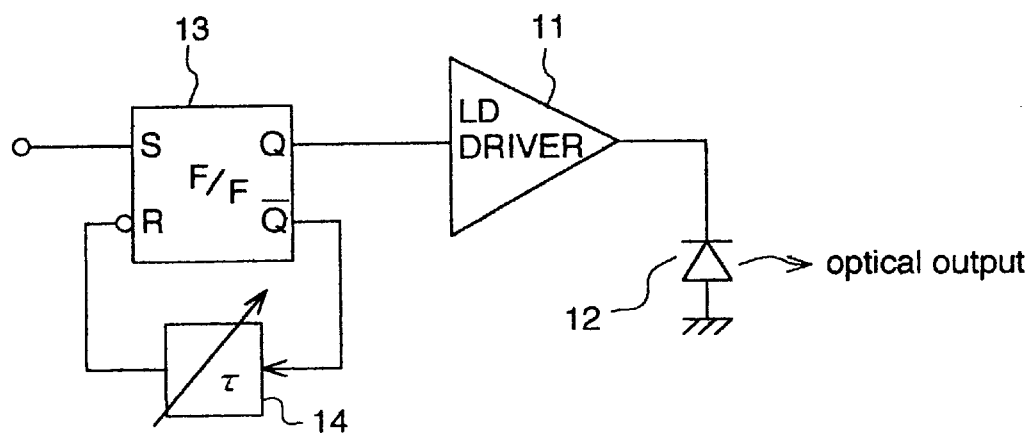
FIG. 1 is a block diagram of an optical transmitter of a first embodiment of the invention.
Figure 2:
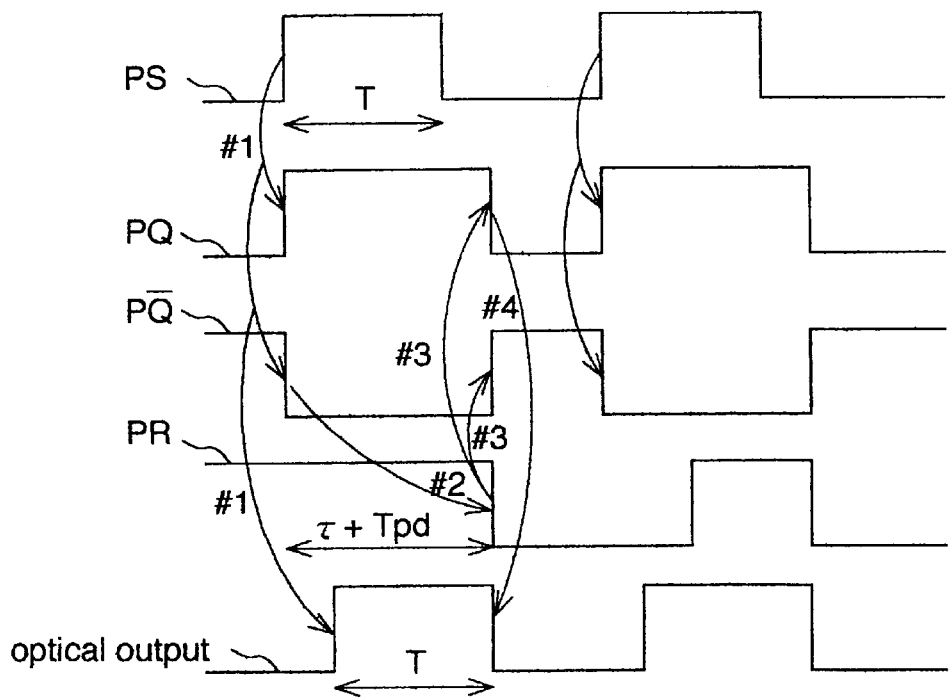
FIG. 2 is a timing chart illustrating operation of the optical transmitter of FIG. 1.

FIG. 1 is a block diagram of an optical transmitter of a first embodiment of the invention, and FIG. 2 is a timing chart illustrating operation of the optical transmitter of FIG. 1.

Referring to FIG. 1, the optical transmitter comprises a flipflop 13 supplied with a transmission signal, a delay circuit 14 for delaying an inverse output of the flipflop 13 to be supplied to the flipflop 13 as a reset signal, a LD driver 11 for amplifying output of the flipflop 13 to a desired level for activating a comparatively low threshold LD 12.

Delay time of the delay circuit 14 is variable and controlled so as to make pulse widths of optical output of the LD 12 equal to pulse widths of the transmission signal. Therefore, optical output having same pulse widths with those of an input transmission signal is obtained in a range higher than 1 Gb/s without degrading the transmission quality.

The transmission signal, which is illustrated by a first pattern PS in FIG. 2, is input to a set terminal S of the flipflop 13. Output signal from output terminal Q is amplified by the LD driver 11 to a sufficient level for activating the LD 12.

Now, operation of the optical transmitter of FIG. 1 is described in connection with FIG. 2.

Outputs of the Q and the $\overline{Q}$ terminals of the flipflop 13 become at logic HIGH and logic LOW respectively at a rising edge of the transmission signal, as the first pattern PS at a timing #1 of FIG. 2, and the optical output of the LD 12 becomes at logic HIGH after the radiation delay td represented by the equation (1). As described above the radiation delay td is about 250 ps when the threshold current Jth and the driving current Jp of the LD 12 is 3.5 mA and 40 mA respectively. Output of the $\overline{Q}$ terminal of the flipflop 13. is input to the reset terminal R of the flipflop 13 after being delayed for a certain time by the delay circuit 14 as a fourth pattern PR of a timing #2 illustrated in FIG. 2. So, outputs of the Q and the $\overline{Q}$ terminals of the flipflop 13 turn to logic LOW and logic HIGH respectively and the optical output becomes at logic LOW, at timings #3 and #4 of FIG. 2.

Therefore, T being a pulse width, by setting the delay time of the delay circuit 14 to 100 ps+T, optical output having the same pulse widths T with those of the transmission signal supplied to the optical transmitter is obtained, since transfer delay Tpd through the flipflop 13 is about 150 ps when the a high-speed flipflop is applied to the flipflop 13.

Thus, the decrease of pulse widths of the optical output because of the radiation delay is eliminated, resulting a stable transmission character.

Figure 3:
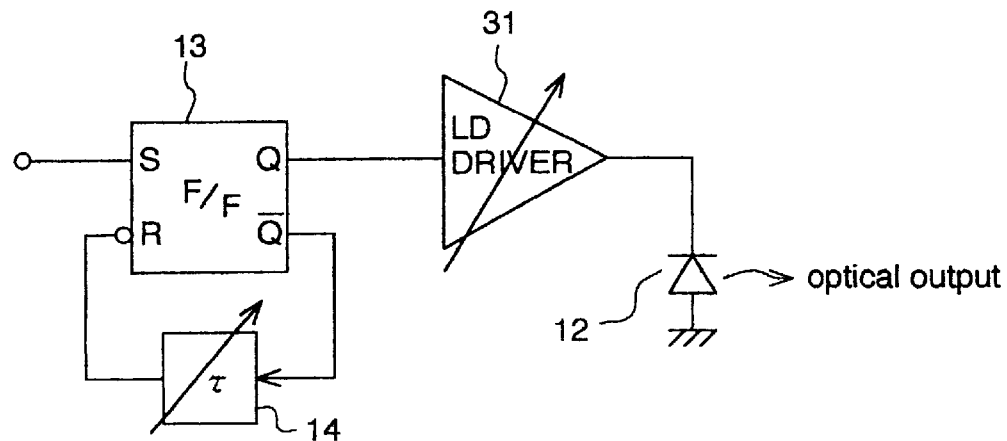
FIG. 3 shows a second embodiment of the invention.

FIG. 3 shows a second embodiment of the invention, where the LD driver 11 of FIG. 1 is replaced with a variable amplitude LD driver 31.

In the second embodiment, the pattern jitters of the optical output from the LD 12 are reduced by applying the variable amplitude LD driver 31 in addition to the elimination of the pulse width decrease, providing a still excellent transmission quality in the range higher than 1 Gb/s without additional circuit for supplying bias current to the LD 12.

It can be seen from the equation (1) that the radiation delay of the optical output of the LD 12 depends also on the driving current Jp supplied to the LD 12 from the variable amplitude LD driver 31. The radiation delay td decreases by increasing the driving current Jp. It means that by setting an appropriate amplitude according to the bit rate of the transmission signal, fluctuation of carrier density in the active layers of the LD 12 can be prevented, resulting in a decrease of the pattern jitters caused by the radiation delay depending on pulse patterns with a simple circuit of low dissipation.

Thus, the errorless transmission speed range higher than 1 Gb/s can be enlarged of the optical transmitter with a low threshold LD.

Figure 4:
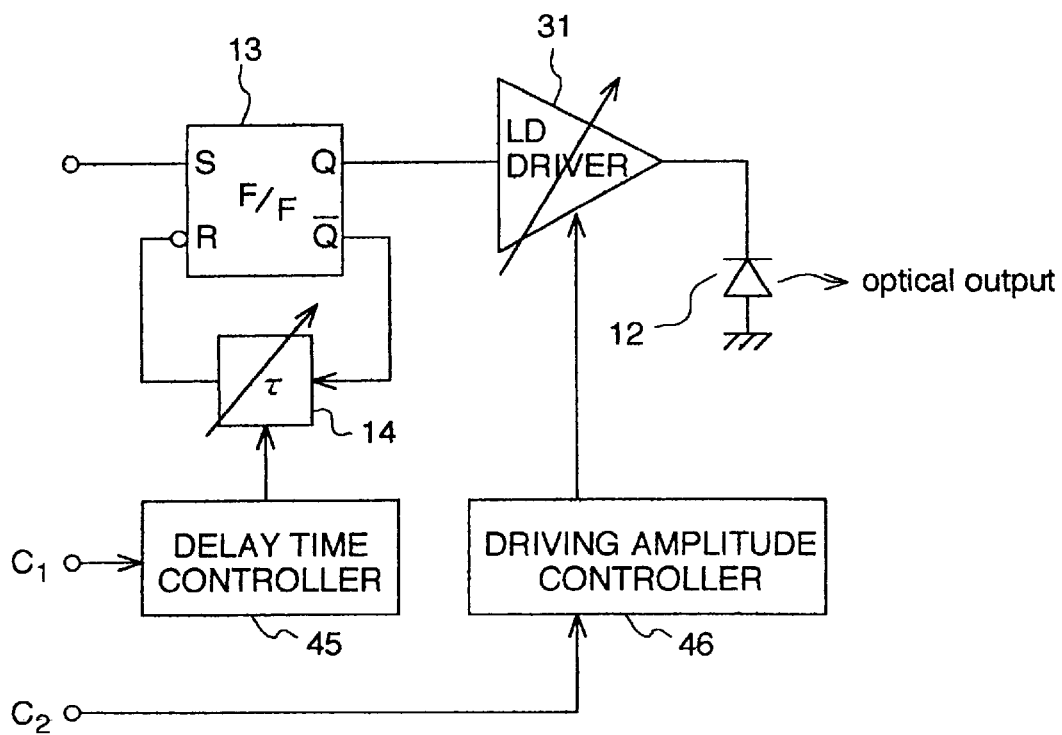
FIG. 4 shows a third embodiment of the invention.
Figure 5:
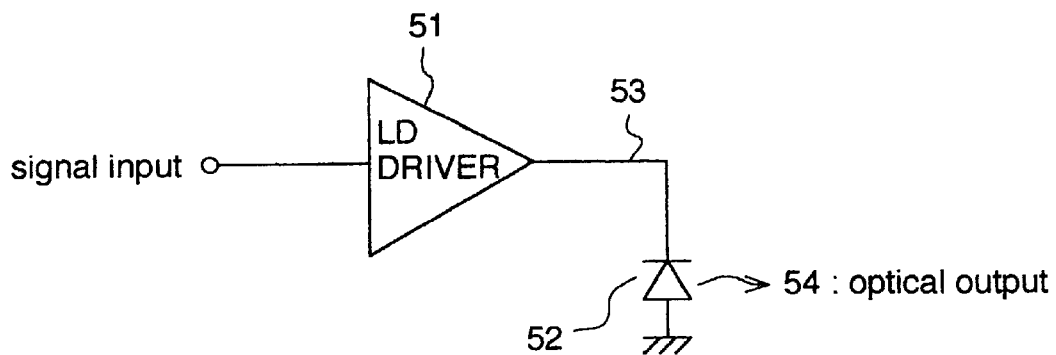
FIG. 5 illustrates a circuit configuration of a conventional optical transmitter.
Figure 6:
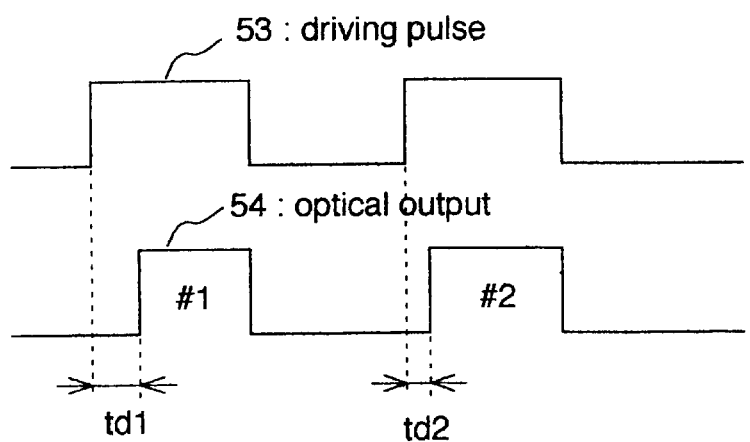
FIG. 6 shows wave forms of a driving pulse 53 and a corresponding optical output 54 of FIG. 5.
Figure 7:
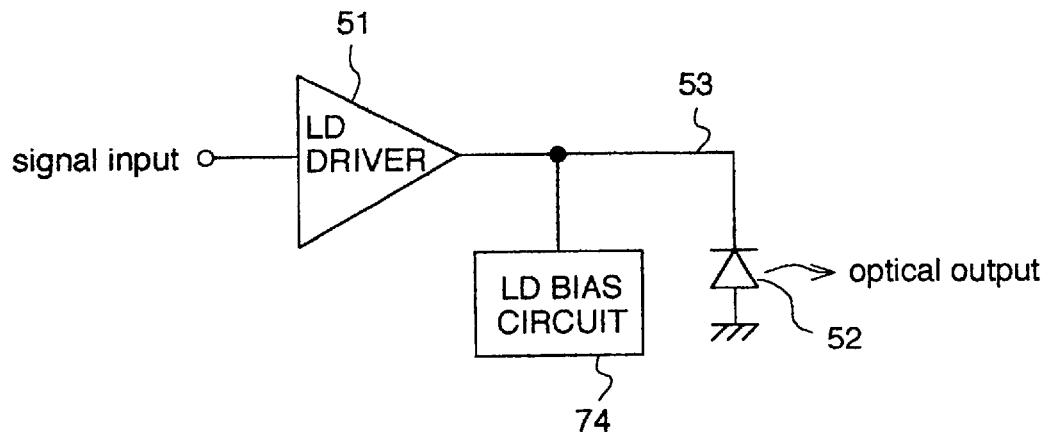
FIG. 7 illustrates a block diagram of a prior art with a LD bias circuit.
Figure 8:
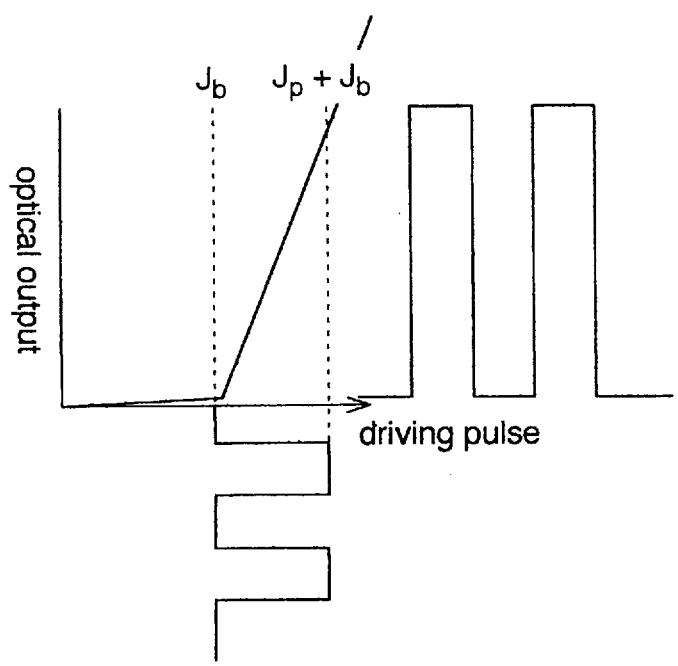
FIG. 8 shows a characteristic of a LD activated with a driving pulse biased.

FIG. 4 shows a third embodiment of the invention, wherein a delay time controller 45 and a driving amplitude controller 46 are provided in addition to the optical transmitter of FIG. 3 for controlling the delay circuit 14 and the variable amplitude LD driver 31 according to control signals C1 and C2 respectively.

So, by supplying appropriate signals C1 and C2 in accordance with transmission speeds, an optical transmitter applicable for various transmission speeds is realized with a high quarity transmission characteristic without pulse width decrease and pattern jitters, even in a range higher than 1 Gb/s.

What is claimed is:

1. An optical transmitter comprising:
    a laser diode having a low threshold characteristic for emitting a laser light according to a pulse current corresponding to a transmission signal;
    equivalence means for egualizing a pulse width of said laser light with a pulse width of said transmission signal, wherein said equivalence means revises said pulse width of said transmission signal; and
    a variable amplitude laser diode driver for amplifying said transmission signal revised by said equivalence means to supply to the laser diode an amplitude determined according to a bit rate of said transmission signal.

2. An optical transmitter comprising:
    laser diode having a low threshold characteristic for emitting a laser light according to a Pulse current corresponding to a transmission signal;

equivalence means for equalizing a pulse width of said laser light with a pulse width of said transmission signal, wherein said equivalence means revises said pulse width of said transmission signal; and a variable amplitude laser diode driver for amplifying said transmission signal revised by said equivalence means to supply to the laser diode an amplitude according to an amplitude control signal.

3. An optical transmitter as recited in claim 1, wherein said equivalence means comprises:

a flipflop having a set terminal supplied with said transmission signal; and a variable delay circuit for delaying an inverse output of said flipflop to be supplied to a reset terminal of said flipflop.

4. An optical transmitter as recited in claim 2, wherein said equivalence means comprises:

a flipflop having a set terminal supplied with said transmission signal; and a variable delay circuit for delaying an inverse output of said flipflop to be supplied to a reset terminal of said flipflop.

* * * * *